United States Patent
Han et al.

(10) Patent No.: US 8,066,863 B2
(45) Date of Patent: Nov. 29, 2011

(54) ELECTRODEPOSITION TECHNIQUE AND APPARATUS TO FORM SELENIUM CONTAINING LAYERS

(75) Inventors: Yongbong Han, Fremont, CA (US); Serdar Aksu, San Jose, CA (US); Bulent M. Basol, Manhattan Beach, CA (US)

(73) Assignee: SoloPower, Inc., San Jose, CA (US)

( * ) Notice: Subject to any disclaimer, the term of this patent is extended or adjusted under 35 U.S.C. 154(b) by 919 days.

(21) Appl. No.: 11/952,905

(22) Filed: Dec. 7, 2007

(65) Prior Publication Data

US 2008/0135415 A1   Jun. 12, 2008

Related U.S. Application Data

(60) Provisional application No. 60/869,102, filed on Dec. 7, 2006.

(51) Int. Cl.
*C25D 5/10* (2006.01)
*C25D 5/50* (2006.01)

(52) U.S. Cl. .................. 205/170; 205/138; 205/224

(58) Field of Classification Search .................. 205/137, 205/170, 224, 138
See application file for complete search history.

(56) References Cited

U.S. PATENT DOCUMENTS

| | | | |
|---|---|---|---|
| 2,450,887 A * | 10/1948 | Escoffery | 252/62.3 S |
| 2,649,409 A | 8/1953 | Von Hippel et al. | |
| 2,833,675 A * | 5/1958 | Weimer | 427/74 |
| 4,581,108 A * | 4/1986 | Kapur et al. | 205/170 |
| 4,798,660 A | 1/1989 | Ermer et al. | |
| 6,048,442 A | 4/2000 | Kushiya et al. | |
| 6,092,669 A | 7/2000 | Kushiya et al. | |
| 6,475,367 B1 * | 11/2002 | Toyama et al. | 205/96 |
| 6,518,086 B2 * | 2/2003 | Beck et al. | 438/95 |

OTHER PUBLICATIONS

Fritz, H.P., et al., "A New Electrochemical Method for Selenization of Stacked CuIn Layers and Preparation of CuInSe$_2$ by Thermal Annealing", *Thin Solid Films*, 247, 1994, pp. 129-133.
Graham, A.K., et al., "Electrodeposition of Amorphous Selenium", *J. of Electrochem. Soc.*, 106:8, 1959, pp. 651-654.
Palm, J., "CIS Module Pilot Processing Applying Concurrent Rapid Selenization and Sulfurization of Large Area Thin Film Precursors", *Thin Solid Films*, 431-432, 2003, pp. 514-522.
Abedin, S.Z., et al., "Electrodeposition of Selenium, Indium and Copper in an air- and water-stable Ioinic Liquid at Variable Temperatures", *Electrochimica Acta*, vol. 52, 2007, pp. 2746-2754.
Cattarin, S., et al., "Cathodic Electrodeposition of Se on Ti Electrods", *J. of Electroanalyt. Chem.*, vol. 415, 1996, pp. 123-132.

(Continued)

*Primary Examiner* — Luan Van
(74) *Attorney, Agent, or Firm* — Pillsbury Winthrop Shaw Pittman LLP

(57) ABSTRACT

A multi step process, which forms a Group VIA material layer, such as a selenium (Se) layer, having a thickness greater than 500 nanometers. The process includes electroplating a Se material layer, which has an amorphous micro-structure and which exhibits high electrical resistivity, on a workpiece and subsequently annealing the Se layer. Annealing process transforms the amorphous structure of the Se layer into a crystalline structure which is conductive. After the annealing, another Se layer can be electroplated onto the annealed Se layer. The electroplating and annealing steps can be repeated until the desired Se layer thickness is reached.

20 Claims, 2 Drawing Sheets

OTHER PUBLICATIONS

Herrero, J., et al., "Electrochemical Synthesis of Photoactive $In_2Se_3$ Thin Films", *Solar Energy Mats.*, vol. 16, 1987, pp. 477-485.

Kemell, M., et al., "Electrochemical Quartz Crystal Microbalance Study of the Electrodeposition Mechanisms of $Cu_{2-x}Se$ Thin Films", *Electochemical Acta*, vol. 45, 2000, pp. 3737-3748.

Massaccesi, S., et al., Electrodeposition of Indium Selenide $In_2Se_3$, *J. of Electroanalyt. Chem.*, vol. 412, 1996, pp. 95-101.

Oliveira, et al., "A Voltammetric Study of the Electrodeposition of $CuInSe_2$ in a Citrate Electrolyte", *Thin Solid Films*, vol. 405, 2002, pp. 129-134.

Subramanian, B., et al.,, "Electrodeposition of Sn, Se, SnSe and the Material Properties of SnSe Films", *Thin Solid Films*, vol. 357, 1999, pp. 119-124.

Von Hippel, A., et al., "The Electroplating of Metallic Selenium", *J. of Chem. Phys.*, vol. 18, No. 9, Sep. 1950, pp. 1243-1251.

Zhang, S.Y., et al., "Electrochemical Synthesis of Selenium Nanotubes by Using CTAB Soft-Template", *Electrochemica Acta*, vol. 50, 2005, pp. 4365-4370.

\* cited by examiner

ELECTRODEPOSITION TECHNIQUE AND APPARATUS TO FORM SELENIUM CONTAINING LAYERS

This application claims the benefit of provisional application Ser. No. 60/869,102 filed on Dec. 7, 2006.

FIELD OF THE INVENTION

The present invention relates to a method and apparatus for preparing selenium bearing films by low cost approaches, and their application to fabrication of semiconductor layers as absorbers for radiation detectors and photovoltaic devices.

BACKGROUND

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal, an insulating foil or web, or a conductive foil or web. The absorber film 12, which comprises a material in the family of $Cu(In,Ga,Al)(S,Se,Te)_2$, is grown over a conductive layer 13, which is previously deposited on the substrate 11 and which acts as the electrical contact to the device. The structure comprising the substrate 11 and the conductive layer 13 is the base 10A. Various conductive layers comprising Mo, Ta, W, and Ti etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown on the surface 13A of the conductive layer 13, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. The preferred electrical type of the absorber film 12 is p-type, and the preferred electrical type of the transparent layer 14 is n-type. However, an n-type absorber and a p-type window layer can also be utilized. The preferred device structure of FIG. 1 is called a "substrate-type" structure. A "superstrate-type" structure can also be constructed by depositing a transparent conductive layer on a transparent superstrate such as glass or transparent polymeric foil, and then depositing the $Cu(In,Ga,Al)(S,Se,Te)_2$ absorber film, and finally forming an ohmic contact to the device by a conductive layer. In this superstrate structure light enters the device from the transparent superstrate side. A variety of materials, deposited by a variety of methods, can be used to provide the various layers of the device shown in FIG. 1.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor vary with the molar ratio of the IIIA elements, i.e. the Ga/(Ga+In) molar ratio. In general, for good device performance Cu/(In+Ga) molar ratio is kept at around or below 1.0. As the Ga/(Ga+In) molar ratio increases, on the other hand, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition. It should be noted that although the chemical formula is often written as $Cu(In,Ga)(S,Se)_2$, a more accurate formula for the compound is $Cu(In,Ga)(S,Se)_k$, where k is typically close to 2 but may not be exactly 2. For simplicity we will continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The first technique that yielded high-quality $Cu(In,Ga)Se_2$ films for solar cell fabrication was co-evaporation of Cu, In, Ga and Se onto a heated substrate in a vacuum chamber. However, low materials utilization, high cost of equipment, difficulties faced in large area deposition and relatively low throughput are some of the challenges faced in commercialization of the co-evaporation approach.

Another technique for growing $Cu(In,Ga)(S,Se)_2$ type compound thin films for solar cell applications is a two-stage process where metallic components of the $Cu(In,Ga)(S,Se)_2$ material, i.e. Cu, In and/or Ga are first deposited onto a substrate as a metallic precursor layer, and then reacted with S and/or Se in a high temperature annealing process. For example, for $CuInSe_2$ growth, thin layers of Cu and In are first deposited on a substrate and then this stacked precursor layer is reacted with Se (selenization) at elevated temperature. If the reaction atmosphere also contains sulfur (sulfidation), then a $CuIn(S,Se)_2$ or CISS layer can be grown. It is also possible to selenize and then sulfidize the Cu/In precursor to obtain a CISS absorber. Addition of Ga in the precursor layer, i.e. use of a stack such as a Cu/In/Ga stacked film metallic precursor, allows the growth of a $Cu(In,Ga)(S,Se)_2$ or CIGSS absorber. It should be noted that we refer to Cu, In and Ga as the metallic components of the CIGS(S) compound whereas Se and S are non-metallic components. Selenium and S are sometimes referred to as "semi-metals" in their crystalline form. In publications, the crystalline form of Se may also be called "metallic Se".

Sputtering and evaporation techniques have been used in prior art approaches to deposit the layers containing the Group IB and Group IIIA components of the precursor stacks. In the case of $CuInSe_2$ growth, for example, Cu and In layers were sequentially sputter-deposited on a substrate and then the stacked film was heated in the presence of gas containing Se at elevated temperature for times typically longer than about 30 minutes, as described in U.S. Pat. No. 4,798,660. More recently U.S. Pat. No. 6,048,442 disclosed a method comprising sputter-depositing a stacked precursor film comprising a Cu—Ga alloy layer and an In layer to form a Cu—Ga/In stack on a metallic back electrode layer and then reacting this precursor stack film with one of Se and S to form the absorber layer. U.S. Pat. No. 6,092,669 described sputtering-based equipment for producing such absorber layers.

Two-stage processing approach may also employ stacked precursor layers comprising Group VIA materials. For example, a $Cu(In,Ga)Se_2$ or CIGS film may be obtained by depositing In—Ga-selenide and Cu-selenide layers in a stacked manner and reacting them in presence of Se. Similarly, stacks comprising Group VIA materials and metallic components may also be used. In—Ga-selenide/Cu stack, for example, may be reacted in presence of Se to form CIGS. Stacks comprising metallic elements as well as Group VIA materials in discrete layers may also be used. Selenium may be deposited on a metallic precursor film comprising Cu, In and/or Ga through various approaches to form stacks such as Cu/In/Ga/Se, Cu—Ga/In/Se, etc. One approach for Se layer formation is evaporation as described by J. Palm et al. ("CIS module pilot processing applying concurrent rapid selenization and sulfurization of large area thin film precursors", Thin Solid Films, vol. 431-432, p. 514, 2003). In their work these authors described preparation of a precursor stack by sputter deposition of a Cu—Ga/In metallic precursor layer followed by evaporation of Se over the In surface. The precursor stack thus formed had a structure of Cu—Ga/In/Se. After rapid thermal annealing or processing (RTP) of the precursor stack and further reaction with S, these researchers reported formation of $Cu(In,Ga)(Se,S)_2$ or CIGS(S) absorber layer.

Evaporation is a relatively high cost technique to employ in large scale manufacturing of absorbers intended for low cost solar cell fabrication. Potentially lower cost techniques such as electroplating have been reported for Se deposition. For example, A. Von Hippel et al. ("Electrodeposition of Se", U.S. Pat. No. 2,649,409, 1953) disclosed that metallic Se may be electroplated using specialized electrolytes and high bath temperatures. Typically Se deposits or films obtained from low temperature baths are of amorphous nature and have high resistivity, which may be higher than $10^4$ ohm-cm. Such high resistivity amorphous layers may not be plated to thicknesses much above about 500 nm unless special care is taken.

Since amorphous Se layers are of high resistivity they can only be deposited to thicknesses of above about 500 nm at low current densities, which may be typically less than about 3 $mA/cm^2$. Otherwise, at higher current densities the high resistivity Se film may electrically break down giving rise to defects and non-uniform coating. A. Graham et al. ("Electrodeposition of amorphous Se", J. Electrochemical Society, vol. 106, p. 651, 1959) have plated 30000 nm thick amorphous Se layers out of special electrolytes at current densities of 0.5-2 $mA/cm^2$. Drawbacks of their technique included short lifetime of the baths as stated by the researchers and the low current densities which would require plating times in the order of 7-24 hours for the deposited layers.

Some information about potential application of electrodeposited Se layers for CIGS absorber formation has also been also published. One specific method published involves depositing a metallic precursor comprising Cu and In on a substrate and then electroplating a Se layer over the Cu/In layer to form a Cu/In/Se stack. This stack may then be heated up to form a $CuInSe_2$ absorber. It should be noted that since CIGS(S) type solar cell absorbers are typically 1-2 um thick, formation of these absorbers require at least about 700 nm, preferably more than 1000 nm thick Se layer. Therefore, any electroplating technique that will be used to deposit Se layer for CIGS(S) type absorber formation is required to provide 700-2000 nm thick Se layer depending on the thickness of the absorber and the details of the absorber formation process. In many CIGS growth approaches, such as RTP, excess Se is needed (typically 20-50% more than the amount needed to form the compound) to assure full reaction of the metallic components of the compound with relatively volatile Se, some of which may evaporate away from the film surface during heating.

As the brief review above demonstrates, thick Se layers may be electroplated on selected substrates in the form of metallic Se, which has a lower resistivity than the amorphous Se. However, plating of metallic Se requires use of high temperature baths and highly acidic bath formulations which are not suitable for large scale production. These baths also have stability problem. If amorphous Se is electroplated out of simple baths, then deposition of relatively thick layers require low plating current densities, typically lower than 2 $mA/cm^2$, and deposition times that may vary from 30 minutes to several hours. In prior art work, several attempts were made to increase the deposition rate and thickness of the electroplated Se layers. One such approach involved illumination of the photoconductive amorphous Se layer during its deposition on the substrate (H. Fritz et al., "A new electrochemical method for selenization of stacked CuIn layers and preparation of CIS by thermal annealing", Thin Solid Films, vol. 247, p. 129, 1994). Through illumination, the effective resistivity of the Se film was reduced to allow higher deposition current densities.

As the review of prior art shows there is a need to develop electroplating techniques that can deposit Group VIA materials comprising Se with a thickness greater than about 500 nm using simple electrolytes and short deposition times.

SUMMARY

A number of sequential electroplating and annealing steps are performed to form a Group VIA material layer with a desired thickness, preferably greater than 500 mm, on a workpiece surface. The workpiece can be a semiconductor, or any other substrate with a conductive surface. In one embodiment, the workpiece is a continuous flexible workpiece for roll-to roll manufacture of solar cell absorbers.

An aspect of the present invention provides a system for forming Group VIA material layers on a surface of a workpiece. The system includes a first electroplating unit to form a first high resistivity layer by electroplating an amorphous Group VIA material over a portion of the surface of the workpiece, a first annealing unit to transform the high resistivity layer into a first conductive layer, and a second electroplating unit to form a second high resistivity layer by electroplating another Group VIA material over the first conductive layer.

Another aspect of the present invention provides a system for forming a Group VIA material layer that is thicker than 200 nano meters, on a front surface of a workpiece. The system includes an electroplating unit to form a high resistivity layer by electroplating a Group VIA material over the front surface of the workpiece, an annealing unit to transform the high resistivity layer into a conductive layer, and a moving mechanism to move the workpiece between the electroplating unit and the annealing unit. The moving mechanism moves the workpiece from the electroplating unit to the annealing unit after the high resistivity layer is formed, and move back the workpiece to the electroplating unit after the conductive layer is formed so that another high resistivity layer is electroplated over the conductive layer using the electroplating unit. The annealing unit utilizes a fluid to heat the high resistivity layer to a temperature in the range of 60-150° C.

Another aspect of the present invention provides a process of electroplating a Group VIA material layer on a front side of a workpiece. The process includes the steps of forming a first high resistivity material layer over the front side of the workpiece by electrodepositing a Group VIA material, transforming the first high resistivity material layer into a first conductive material layer by heating, and forming a second high resistivity material layer over the first conductive material layer by electrodepositing another Group VIA material. The Group VIA material and the another Group VIA material may be the same material.

Another aspect of the present invention provides a process of forming on a base a precursor stack comprising a Group IB material, a Group IIIA material and a Group VIA material. The process includes the steps of forming a first material structure including at least one of a Group IB material layer and a Group IIIA material layer on the base, electroplating a first layer of a Group VIA material on the first material structure, wherein the layer of the Group VIA material is an amorphous layer, and converting the first layer of the Group VIA material into a crystalline layer by annealing. Further, the process includes the step of forming a second material structure including at least one of a Group IB material layer and a Group IIIA material layer on the first layer of the Group VIA material after the step of converting.

DETAILED DESCRIPTION

The method of the present invention provides a multi-step approach for the deposition of Group VIA material layers which may have a thickness of greater than 500 nm.

In an embodiment of the present invention, a number of sequential electroplating and annealing steps are performed to form a Group VIA material layer with a desired thickness, preferably greater than 500 nm, on a workpiece surface. Accordingly, in a first Group VIA material electroplating step, a first amorphous layer is formed on the workpiece surface. The first amorphous layer has high electrical resistivity. In a first anneal step, the first amorphous layer is transformed into a first crystalline layer, which is a conductive layer. In a second Group VIA material electroplating step, a second amorphous layer is formed on the workpiece surface. The second amorphous layer has high electrical resistivity. In a second anneal step, the second amorphous layer may be transformed into a second crystalline layer, which is conductive. The electroplating and anneal steps may be repeated until the desired thickness of Group VIA material is achieved.

The workpiece may be a metal, a semiconductor, or any other substrate, even an insulating substrate, with a conductive surface. In one embodiment, the workpiece is a continuous flexible workpiece suitable for roll-to roll manufacture of solar cell absorbers. On the continuous flexible workpiece, a Group VIA material layer may be continuously formed with a desired thickness. A continuous flexible workpiece may, for example, have a length of 1 to 2000 meters with a width of 0.1 to 2 meters. The continuous flexible workpiece used in the process may include a base having a conductive substrate and a contact layer. The substrate may be a flexible steel foil or steel web. The continuous flexible workpiece used in the process may further include a contact layer deposited on a surface of the substrate forming a base and a primary material structure such a precursor layer or stack formed on the base. The precursor layer may include Cu, Ga and In metals.

Figure 1:
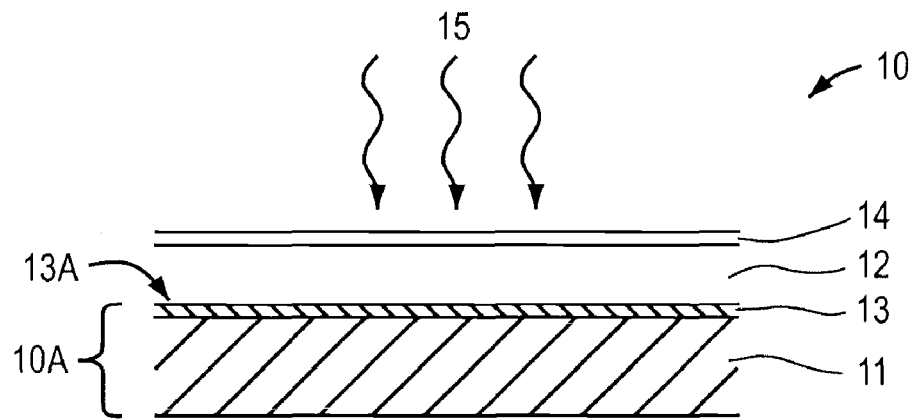
FIG. 1 is a schematic illustration of a structure of a thin film Group IBIIIAVIA solar cell.
Figure 2:
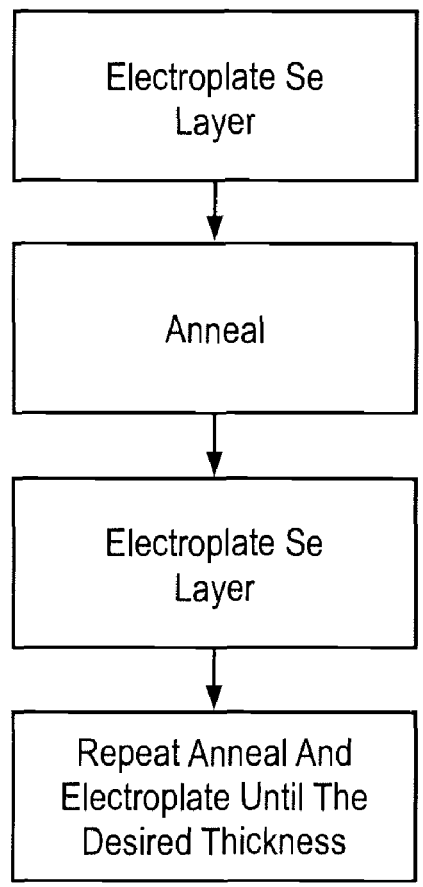
FIG. 2 is a flow chart showing the process steps of electroplating an exemplary Se layer.

The flow chart in FIG. 2 exemplifies an embodiment of a process of the present invention to electrodeposit a Se layer with desired thickness. The first step of the process may be electrodeposition of a first Se film on a base. The Se film is amorphous in nature and it may have a thickness of less than 500 nm, preferably a thickness of less than 200 nm, and most preferably within the range of 100-200 nm. The second step of the process may be an annealing step where the amorphous Se film is heat treated at a temperature higher than about 50° C., preferably higher than 70° C. to convert the amorphous film, at least partially, into metallic Se. The third step of the process may be electrodeposition of a second Se film over the converted Se film. The annealing and electroplating steps may then be repeated multiple times to increase the total thickness of the electroplated Se on the base to obtain a desired thickness.

It should be noted that the present invention avoids many of the problems of the prior art techniques. First of all, thin layers (typically in the range of 100-200 nm) of Se are electroplated during the electrodeposition steps. Therefore, high current densities in the range of about 2-100 mA/cm$^2$, preferably in the range of 4-20 mA/cm$^2$ may be employed without electrically breaking down the thin amorphous Se films that are being deposited. The thinner the deposited Se film, the higher the current density one may utilize. It would not be possible to continue amorphous Se electroplating under the high current density conditions to increase its thickness. However, by introducing annealing steps in between the electroplating steps, the Se films are converted into metallic phase with lower resistivity so that each additional layer of amorphous Se may still be deposited thereover at a high current density. Conductive or metallic Se layers have resistivities that are 10-1000 times lower compared to amorphous layers.

The annealing step(s) may be carried out using an oven, heating lamps, lasers etc. Alternately, heating may be achieved by directing a hot fluid onto the Se film. Hot fluid may be a hot gas such as heated air, or hot liquid such as heated water. Hot water may be employed to rinse the Se plated base after each plating operation. This way rinsing and cleaning may be achieved at the same time the plated amorphous Se film is converted into metallic Se layer. The annealing temperature may be in the range of 50-240 C, preferably in the range of 60-150 C, more preferably in the range of 70-120 C. It should be noted that higher the temperature, faster would be the conversion of the Se film from the amorphous phase into the metallic phase. Lower temperature ranges below the melting point of Se are preferable because annealing at low temperatures may be carried out in air or hot liquid without necessitating use of an inert environment. High annealing temperatures where Se reacts with the underlying metallic precursor comprising Cu, In and Ga are preferably avoided. The purpose of the annealing here is to crystallize the Se layer without causing any substantial reaction between the Group VIA material(s), the Group IB and/or Group IIIA materials within the precursor layer.

Figure 3A:
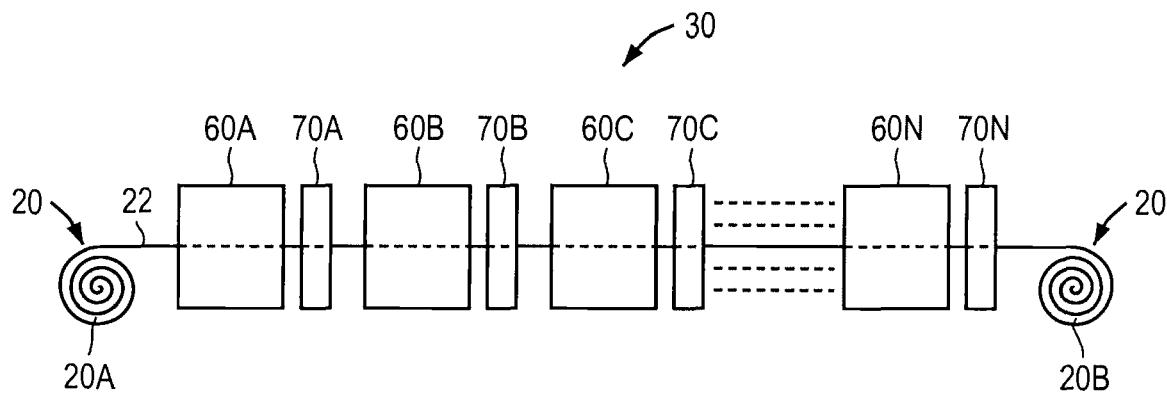
FIG. 3A is a schematic illustration of an embodiment of a reel-to-reel processing system to electroplate a Se layer.

Present invention is particularly suited for an in-line or reel-to-reel processing approach. FIG. 3A schematically shows a reel-to-reel system 30 with capability to deposit thick Se layers on a flexible base 22 using multiple plating and heating cycles. The reel-to-reel system 30 comprises a series of process units such as a series of electroplating units 60A, 60B, ... 60N, and a series of annealing units 70A, 70B, ... 70N, a moving mechanism 20 that includes a supply spool 20A and a return spool 20B to direct the flexible foil base 22 from the supply spool 20A to the return spool 20B through the series of units. Each electroplating unit 60A, 60B, ... 60N, may additionally comprise an integrated cleaning or a cleaning/drying unit so that as the flexible foil base 22 may be cleaned after each plating step. Alternately, as stated before, the annealing units 70A, 70B, ... 70N, may actually be the cleaning units applying hot fluid such as hot water to the flexible foil base 22 so that annealing and cleaning is carried out at the same time. It should be noted that the number of the process units may be changed to obtain thinner or thicker Se layers. Each electrodeposition unit may deposit a Se layer with a thickness in the range of 10-300 nm, preferably in the range of 100-200 nm. The last annealing unit 70N placed after the last plating unit 60N may or may not be used since it may not be necessary to convert the last electrodeposited amorphous Se film into metallic Se since there may not be electroplating performed over this layer.

Figure 3B:
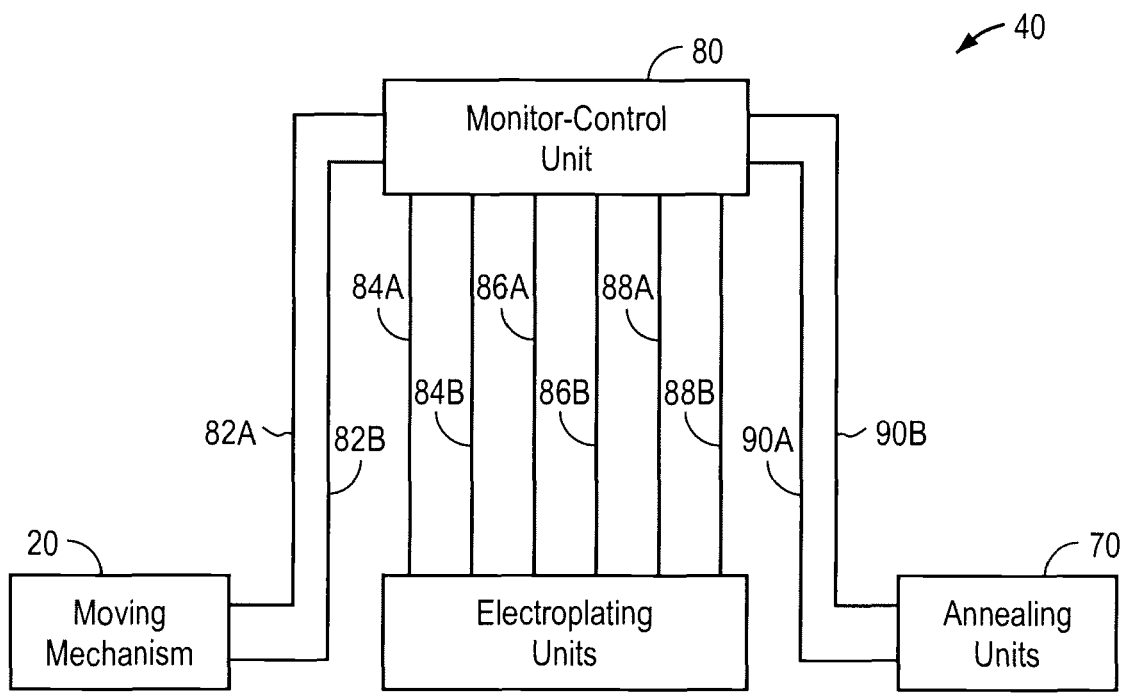
FIG. 3B is a diagram showing an embodiment of a control system of the reel-to-reel processing system shown in FIG. 3A.

FIG. 3B shows a control system 40 to control and monitor the reel-to-reel processing system 30 shown in FIG. 3A. The control system 40 includes a monitor-control unit 80, which unit 80 is used to monitor and/or control each of the moving mechanism 20, the electroplating units 60, and/or the annealing units 70. While the monitor-control unit 80 is shown as a single unit, it is understood that the monitor-control functions as described herein can be distributed, such that individual monitor and/or control of the various mechanisms and units can occur. Preferably, the monitor-control unit is integrated to allow for better real-time changes to be made to the processing conditions, and as such a description of such monitor and control is provided hereinafter, though it will be readily apparent that specific monitors and controls can be independently performed. In the preferred embodiment, the monitor-control unit 80 is preferably implemented using a computer with a processor and which contains application software that will receive the monitor signals, and, according to a program that determines the desired profile for the resulting structure, control each of the different mechanisms and units as described herein. Given the descriptions herein, the manner in which this programming is implemented will be apparent.

In a preferred embodiment, the monitor-control unit 80 will monitor and control the speed of the moving mechanism 20 with a monitor signal 82A and a control signal 82B, such that the monitor signal indicates the actual speed, and the control signal 82B that adjusts the actual speed. Controlling and monitoring the speed of the moving mechanism 20 allows for creating a profile for the electroplating and annealing as described herein, since there is then control over the times that each of the various different portions of the flexible foil base 22 are disposed within each of the electroplating units 60 and the annealing units 70.

In this preferred embodiment, the monitor-control unit 80 will also monitor and control the electroplating units 60, by having a current density monitor signal 84A and a current density control signal 84B associated with each electroplating unit 60, such that the amount of current applied within an electroplating unit 60 is controlled, preferably in accordance with an overall profile. It should be noted that current density applied to a base during an electrodeposition process and the time period during which this current density is applied, determine the thickness of the deposit formed on the base. Higher current densities and longer deposition times yield thicker deposits. Once the electrodeposition efficiency is known, it is possible to predetermine the deposit thickness as a function of charge, which can be obtained by integrating deposition current over the deposition period. The monitor-control unit 80 will also monitor and control the temperature of the bath within each of the electroplating units 60, by having a temperature monitor signal 86A and a temperature control signal 86B associated with each electroplating unit 60, such that the actual temperature of the bath is monitored and can be changed using the signals 86A and 86B, respectively. Further, monitor and control plating solution signals 88A and 88B, respectively, such that the monitor signal 86A can monitor a characteristic of the plating solution to determine whether there is a need for replenishment, with the control signal 88B controlling such replenishment, associated with each electroplating unit 60. It is noted that there may be different monitor signals 88A for different characteristics of the bath, such as pH value, composition, volume, etc., which can together be analyzed by a computer to adjust not only the replenishment of the plating solution, but also the pH, liquid level and temperature of the plating solution, such that over a period of time these variables may be adjusted to take into account the age of the solution. Such plating solution monitor and control signals can be obtained by specialized sensors such as pH meter probes, liquid level probes, ion selective electrodes, etc.

Still further, the monitor-control unit 80 may also monitor and control the annealing units 70, by having an anneal temperature monitor signal 90A and an anneal temperature control signal 90B associated with each annealing unit 70, such that the annealing temperature within each of the annealing unit 70 is controlled, preferably in accordance with the overall profile, thereby ensuring that the crystalline structure of the amorphous Se layer has the desired resistivity as described herein.

It shall be apparent from the above description that use of the monitor-control unit 80 facilitates accurate processing times for electroplating and annealing, to produce the various different Se layers having thickness and crystallinity characteristics as described herein. The invention will now be further described using the following example.

EXAMPLE

A Se electrodeposition electrolyte comprising 1M $H_2SeO_3$ and about 0.4M NaOH was used. The pH value was adjusted to about 6. An electroplated Cu/Ga/Cu/In stack, i.e. a metallic precursor, was formed on a base comprising a stainless steel foil substrate and a conductive contact layer comprising Mo. Selenium electroplating was carried out on top of the stack at a current density in the range of 2-10 $mA/cm^2$. After each Se electrodeposition step, a reddish color amorphous Se film with an average thickness of about 200 nm was formed in a few seconds depending on the current density used. The base was then dipped in hot water kept at 75-85° C. for 10-30 seconds, during which time the color of the deposit turned metallic, indicating conversion of at least a part of the amorphous Se into crystalline metallic Se phase which is conductive. Electrodeposition and hot water annealing steps were repeated 8 times. The resulting Se layer was measured to be about 1600 nm thick and it was highly adherent to the substrate. While this example shows that there are thus 8 different Se layers deposited to obtain a thick Se layer at the end of the process, it is understood that the number of layers can vary to obtain various different thicknesses of Se. It is also noted that, as shown by this example, processing of multiple Se layers can be quickly obtained, such that each layer of between 100-200 nm can be electroplated and annealed in about 0.5-2 minutes. Since the process can be carried out in an in-line fashion, several Se deposition and annealing steps may be carried out at the same time at different portions of an elongated base such as a long flexible workpiece. Thus Se layers with thicknesses ranging from 400-4000 nm may be obtained at high rate by using two or more electroplating and annealing stations or units.

It should be noted that the present invention may be used to electrodeposit high quality Se layers on top of metallic precursors comprising Cu, In and Ga which may be prepared by a variety of techniques including physical vapor deposition, ink deposition, electroplating etc. The Se containing precursors thus obtained, such as the Cu/Ga/Cu/In/Se stack of the above example, may then be anneal-reacted and a CIGS film may be formed after reaction of Cu, In, Ga and Se with each other. If the anneal-reaction environment contains S or if the CIGS film is further annealed in an environment comprising S, then a CIGS(S) layer may be obtained.

The electroplating/heating cycle employed in the present invention for Se film deposition may also enable formation of high quality all-electroplated precursor stacks comprising Cu, In, Ga and Se wherein at least one Se film is placed under at least one of a Cu film, a Ga film and an In film. These stacks may be formed with almost any sequence and they include, but are not limited to, structures such as Cu/Ga/Se/In, Cu/Ga/Se/In/Se, Cu/In/Se/Ga, Cu/Ga/Se/In/Se/Cu, Cu/Se/Ga/Se/In etc. In these structures the total Se thickness within the stack may be adjusted so that after the anneal-reaction step the right composition of the desired compound is formed.

Formation of an exemplary Cu/Ga/Se/In stack in accordance with the present invention would involve: i) electrodeposition of a Cu layer on a base, ii) electrodeposition of a Ga layer on the Cu layer, iii) electrodeposition of an amorphous Se layer on the Ga layer, iii) annealing to convert the amorphous Se layer into metallic Se film, and iv) electrodeposition of an In layer on the metallic Se film. It should be noted that conversion of the high resistivity amorphous Se layer into lower resistivity metallic Se film allows electrodeposition of another metal (indium in this example) onto the metallic Se surface efficiently. It should also be noted that other anneal steps may be added to the overall process flow to promote alloying between species of the deposited layers. In the above example, for instance, after the electrodeposition of the Ga layer, the Cu/Ga structure may be heat treated to form a Cu—Ga alloy layer before the Se layer is first electrodeposited and then annealed to convert it into a metallic Se film.

Although the invention is described using pure Se electroplating, it may also be applied to electrodeposition of alloys or mixtures of Se with other Group VIA materials. In that respect, layers of $Se_xS_{(1-x)}$ and $Se_xTe_{(1-x)}$ may be electrodeposited according to the present invention, where x is greater than 0 and less than or equal to 1. Similarly, films comprising $Se_y(S_zTe_{(1-z)})_{(1-y)}$ may also be electroplated, where z may be between 0 and 1 and y may be greater than 0 and less than or equal to 1. Various voltage/current waveforms may be used for the plating steps such as DC, pulsed, and pulse-reverse. After deposition of Se and or S on the metallic precursor stack comprising Cu, In and Ga, the precursor thus obtained may be reacted at high temperature in the range of 400-600° C. using various heating means including rapid thermal processing. This way, a CIGS(S) compound film may be obtained.

Solar cells may be fabricated on the CIGS(S) compound layers of the present invention using materials and methods well known in the field. For example a thin (<0.1 microns) CdS layer may be deposited on the surface of the compound layer using the chemical dip method. A transparent window of ZnO may be deposited over the CdS layer using MOCVD or sputtering techniques. A metallic finger pattern is optionally deposited over the ZnO to complete the solar cell.

Various aspects of the present invention include, but are not limited to, the following. (a) A thick Se-bearing Group VIA material layer is formed ion a base by electroplating a Se-bearing Group VIA material layer, annealing the Se-bearing Group VIA material layer to form an annealed conductive film, and electrodepositing another Se-bearing Group VIA material layer on the annealed film. (b) The steps of annealing and electrodepositing are repeated. (c) The step of annealing is carried out at a temperature range of 60-150° C. (d) The step of annealing is carried out by exposing the surface of the electrodeposited Se-bearing Group VIA material layer to a fluid heated to a temperature in the range of 60-150° C. (e) The step of annealing is carried out by exposing the surface of the electrodeposited Se-bearing Group VIA material layer to water heated to a temperature in the range of 60-100° C. (t) The Se-bearing Group VIA material layer is a Se layer. And, (g) The Se-bearing Group VIA material layer is a $Se_y(S_zTe_{(1-z)})_{(1-y)}$ layer, where $0 \leq z \leq 1$ and $0 < y \leq 1$.

Although the present invention is described with respect to certain preferred embodiments, modifications thereto will be apparent to those skilled in the art.

We claim:

1. A process of electrodepositing a layered Group VIA material structure on a front side of a solar cell workpiece, comprising:
    providing the solar cell workpiece, the workpiece containing at least one of a Group IB and Group IIIA material;
    forming a first high resistivity material layer having a thickness of less than about 200 nm directly on the front side of the solar cell workpiece by electrodepositing a first amorphous Group VIA material;
    transforming the first high resistivity material layer into a first conductive material layer by low temperature heating and crystallizing, wherein the low temperature is selected so that the first conductive material layer does not substantially react with any of the Group IB and Group IIIA materials of the solar cell workpiece during the transforming of the first high resistivity material layer;
    forming a second high resistivity material layer having a thickness of less than about 200 nm directly on the first conductive material layer by electrodepositing a second amorphous Group VIA material; and
    transforming the second resistivity material layer into a second conductive material layer by low temperature heating and crystallizing, wherein the low temperature is selected so that the second conductive material layer does not substantially react with any of the Group IB and Group IIIA materials of the solar cell workpiece during the transforming of the second high resistivity material layer.

2. The process of claim 1, wherein the first amorphous Group VIA material and the second amorphous Group VIA material are the same material.

3. The process of claim 2, wherein the Group VIA material is Se.

4. The process of claim 1 further comprising the steps of:
forming a third high resistivity material layer having a thickness of less than about 200 nm directly on the second conductive material layer by electrodepositing a third amorphous Group VIA material; and
transforming the third resistivity material layer into a third conductive material layer by low temperature heating and crystallizing, wherein the low temperature is selected so that the third conductive material layer does not substantially react with any of the Group IB and Group IIIA materials of the solar cell workpiece during the transforming of the third high resistivity material layer.

5. The process of claim 4, wherein each of the first, second and third conductive material layers have a resistivity that is at least 10 times lower than the resistivity of the respective first, second and third high resistivity material layers.

6. The process of claim 1, wherein the steps of forming the first high resistivity material layer, transforming the first high resistivity material layer into the first conductive layer, forming the second high resistivity material layer, and transforming the second high resistivity material layer into the second conductive layer are performed by moving the solar cell workpiece into and sequentially through a first electroplating unit, a first annealing unit, a second electroplating unit and a second annealing unit by a roll to roll process assembly, wherein the roll to roll process assembly comprises a feed roll of the solar cell workpiece to unwrap and feed unprocessed portions of the solar cell workpiece into the system and a take-up roll of the solar cell workpiece to receive processed portions of the solar cell workpiece and wrap them around.

7. The process of claim 1, wherein the heating comprises annealing each of the first and second high resistivity material layers in a fluid heated to a temperature range of 60-100° C.

8. A process of forming on a base a layered precursor stack, the process comprising:
electroplating a first material structure including at least one of a Group IB material layer and a Group IIIA material layer on the base;
electroplating a first layer of a Group VIA material having a thickness of less than about 200 nm directly on the first material structure, wherein the first layer of the Group VIA material is an amorphous layer;
converting the first layer of the Group VIA material into a first crystalline layer by annealing, wherein during the step of converting the first layer the Group VIA material does not substantially react with any of the first material structure including the at least one of the Group IB material layer and the Group IIIA material layer;
electroplating a second material structure including at least one of a Group IB material layer and a Group IIIA material layer directly on the first layer of the Group VIA material after the step of converting the first layer;
electroplating a second layer of a Group VIA material having a thickness of less than about 200 nm directly on the second material structure, wherein the layer of the Group VIA material is an amorphous layer; and
converting the second layer of the Group VIA material into a second crystalline layer by annealing, wherein during the step of converting the second layer the Group VIA material does not substantially react with any of the second material structure including the at least one of the Group IB material layer and the Group IIIA material layer.

9. The process according to claim 8, wherein each of the first and second crystalline layers have a resistivity that is at least 10 times lower than the resistivity of the respective first and second layers of the Group VIA material.

10. The process of claim 8 further comprising electroplating a third material structure including at least one of a Group IB material layer and a Group IIIA material layer directly on the second layer of the Group VIA material after the step of converting the second layer into the second crystalline layer.

11. The process of claim 8, wherein, the first material structure includes a Cu layer and a Ga layer; the first layer includes a Se layer; and the second material structure includes an In layer.

12. The process of claim 11, wherein, the first material structure, the first layer and the second material structure are deposited in the order of Cu/Ga/Se/In.

13. The process of claim 8, wherein the first material structure includes a Cu layer and an In layer; the first layer includes a Se layer; and the second material structure includes a Ga layer.

14. The process of claim 13, wherein the first material structure, the first layer and the second material structure are deposited in the order of Cu/In/Se/Ga.

15. The process of claim 10, wherein the first material structure includes a Cu layer, Ga layer; the first layer includes a Se layer; the second material structure includes an In layer; and the second layer includes a Se layer.

16. The process of claim 15, wherein the first material structure, the first layer, the second material structure and the second layer are deposited in the order of Cu/Ga/Se/In/Se.

17. The process of claim 10, wherein the first material structure includes a Cu layer, the first layer includes a Se layer; the second material structure includes a Ga layer; the second layer includes a Se layer; and the third material structure includes an In layer.

18. The process of claim 17, wherein the first material structure, the first layer, the second material structure, the second layer and the third material structure are deposited in the order of Cu/Se/Ga/Se/In.

19. The process of claim 10 wherein the first material structure includes a Cu layer, and a Ga layer, the first layer includes a Se layer; the second material structure includes an In layer; the second layer includes a Se layer; and the third material structure includes a Cu layer.

20. The process of claim 19, wherein the first material structure, the first layer, the second material structure, the second layer and the third material structure are deposited in the order of Cu/Ga/Se/In/Se/Cu.

* * * * *